US009873340B2

United States Patent
Hisada et al.

(10) Patent No.: US 9,873,340 B2
(45) Date of Patent: Jan. 23, 2018

(54) INVERTER CONTROLLER, ELECTRIC POWER CONVERTER, AND ELECTRIC VEHICLE WITH SELECTABLE RESISTANCE VALUES

(71) Applicant: KABUSHIKI KAISHA TOSHIBA, Minato-ku (JP)

(72) Inventors: Hideki Hisada, Yokkaichi (JP); Masaaki Ichinoseki, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 160 days.

(21) Appl. No.: 14/836,119

(22) Filed: Aug. 26, 2015

(65) Prior Publication Data

US 2016/0089991 A1 Mar. 31, 2016

(30) Foreign Application Priority Data

Sep. 30, 2014 (JP) .................................. 2014-201867

(51) Int. Cl.
*H02M 7/48* (2007.01)
*B60L 11/18* (2006.01)
(Continued)

(52) U.S. Cl.
CPC ........... *B60L 11/1803* (2013.01); *H02M 7/48* (2013.01); *H02M 7/53875* (2013.01); *H03K 17/166* (2013.01); *H02M 1/32* (2013.01)

(58) Field of Classification Search
None
See application file for complete search history.

(56) References Cited

U.S. PATENT DOCUMENTS

2003/0002310 A1* 1/2003 Madenokouji ........ H02M 7/797
363/132
2012/0235611 A1* 9/2012 Kuwabara ......... H02M 7/53873
318/400.17

(Continued)

FOREIGN PATENT DOCUMENTS

CN 1395348 A 2/2003
CN 102684541 A 9/2012
(Continued)

OTHER PUBLICATIONS

Office Action dated Sep. 4, 2017 in Chinese Patent Application No. 201510543040.5.
(Continued)

*Primary Examiner* — Jeffrey Gblende
(74) *Attorney, Agent, or Firm* — Oblon, McClelland, Maier & Neustadt, L.L.P.

(57) ABSTRACT

According to one embodiment, the inverter control device includes a signal generator. The signal generator outputs a signal to increase the resistance of the gate when the value of the DC voltage is equal to or greater than a first voltage threshold, and the value of the AC current is less than a first current threshold; and when the value of the DC voltage is equal to or greater than the first voltage threshold, and the value of the AC current is equal to or greater than a second current threshold, and outputs the signal to increase the resistance of the gate when the value of the DC voltage is equal to or greater than a second voltage threshold, and the value of the AC current is equal to or greater than the first current threshold and less than the second current threshold.

6 Claims, 3 Drawing Sheets

(51) Int. Cl.
  *H02M 7/5387* (2007.01)
  *H03K 17/16* (2006.01)
  *H02M 1/32* (2007.01)

(56) References Cited

U.S. PATENT DOCUMENTS

2014/0001839 A1    1/2014  Kakimoto
2014/0092655 A1*   4/2014  Igarashi ................. B60L 3/003
                                                    363/56.03
2014/0132278 A1*   5/2014  Tang .................... G01R 31/025
                                                    324/509

FOREIGN PATENT DOCUMENTS

| CN | 103250339 A   | 8/2013  |
| CN | 103516246 A   | 1/2014  |
| EP | 2 501 030 A2  | 9/2012  |
| JP | 05-328746     | 12/1993 |
| JP | 2001-346376   | 12/2001 |
| JP | 2002-125362   | 4/2002  |
| JP | 2003-274672 A | 9/2003  |

OTHER PUBLICATIONS

Extended European Search Report dated May 4, 2016 in Patent Application No. 15182638.5.

* cited by examiner

INVERTER CONTROLLER, ELECTRIC POWER CONVERTER, AND ELECTRIC VEHICLE WITH SELECTABLE RESISTANCE VALUES

CROSS-REFERENCE TO RELATED APPLICATIONS

This application is based upon and claims the benefit of priority from Japanese Patent Application No. 2014-201867, filed Sep. 30, 2014; the entire contents of which are incorporated herein by reference.

FIELD

Embodiments described herein relate generally to an inverter control apparatus, a power conversion apparatus, and an electric vehicle.

BACKGROUND

Inverters comprise a DC line that is connected to a DC power supply, and a pair of switching elements connected in series between the high potential side and the low potential side of the DC line, for example. The connection point of the pair of switching elements is connected to an AC load electrically.

There is a case where a large voltage (surge voltage) is instantaneously applied in synchronism with switching the switching elements of an inverter. The amount of the surge voltage depends on various conditions such as a switching speed of the switching elements.

Conventionally, it is suggested, for an inverter adopting power semiconductor switching elements (IGBT, MOSFET, etc.) that control a current by the amount of gate charge, to change the switching speed by switching the gate charge current only in a small current area, or to extend a life time of switching elements by changing the gate resistance of switching elements in accordance with the load amount.

As the speed of switching of the switching element becomes faster, the amount of change in current flowing through a switching element becomes larger, and the surge voltage also becomes larger. In light of this phenomenon, a method for controlling the gate charge current in accordance with the voltage of the DC power supply has been suggested.

In addition, it is known that if a contactor provided to the DC line shuts off the DC line to protect the DC power supply, or the DC power supply is opened due to a failure during regenerative operation of an inverter, the voltage of a smoothing capacitor provided at the DC power supply in/out unit of the inverter abruptly increases for a short time. In this situation, if a response time of a control means detecting an over-voltage is insufficient, it is suggested to provide a means for blocking a PWM signal if the voltage exceeds a predefined voltage.

However, for an inverter capable of adjusting the speed of switching, a threshold for detecting an over-voltage has to be set as equal to or less than the value obtained by subtracting the maximum surge voltage for the maximum speed of switching from the maximum rated voltage of a capacitor and a semiconductor element. Accordingly, the difference between the maximum voltage to be applied to a switching element and the threshold becomes small (over-voltage detection margin) during normal operation, and it may result in a malfunction when detecting an over-voltage. To ensure an over-voltage detection margin, it is necessary to lower the maximum speed of switching to switch the surge voltage. This may increase switching losses in an inverter.

DETAILED DESCRIPTION

According one embodiment, an inverter controller comprises a PWM signal generator that receives an output instruction from an external device, a value of a voltage between DC lines connected between a DC load and an inverter, a value of a current of an AC line connected between the inverter and an AC load, generates and outputs a PWM signal for each of a plurality of switches of the inverter to accomplish a value indicated by the output instruction, and switches a resistance of a gate of each of the switches based on the values of the voltage between the DC lines and the current of the AC line; a driving circuit that outputs a gate driving signal to each of the switches upon reception of the PWM signal, wherein the PWM signal generator outputs the first switch signal to increase the resistance of the gate when the value of the voltage between the DC lines is equal to or greater than a first voltage threshold, and the value of the current of the AC line is less than a first current threshold; and when the value of the voltage between the DC lines is equal to or greater than the first voltage threshold, and the value of the current of the AC line is equal to or greater than a second current threshold greater than the first current threshold. The PWM signal generator outputs the first switch signal to increase the resistance of the gate when the value of the voltage between the DC lines is equal to or greater than a second voltage threshold greater than the first voltage threshold, and the value of the current of the AC line is equal to or greater than the first current threshold and less than the second current threshold.

In the following, the inverter control apparatus, the power conversion apparatus, and the electric vehicle according to an embodiment will be described in detail with reference to the drawings.

Figure 1:
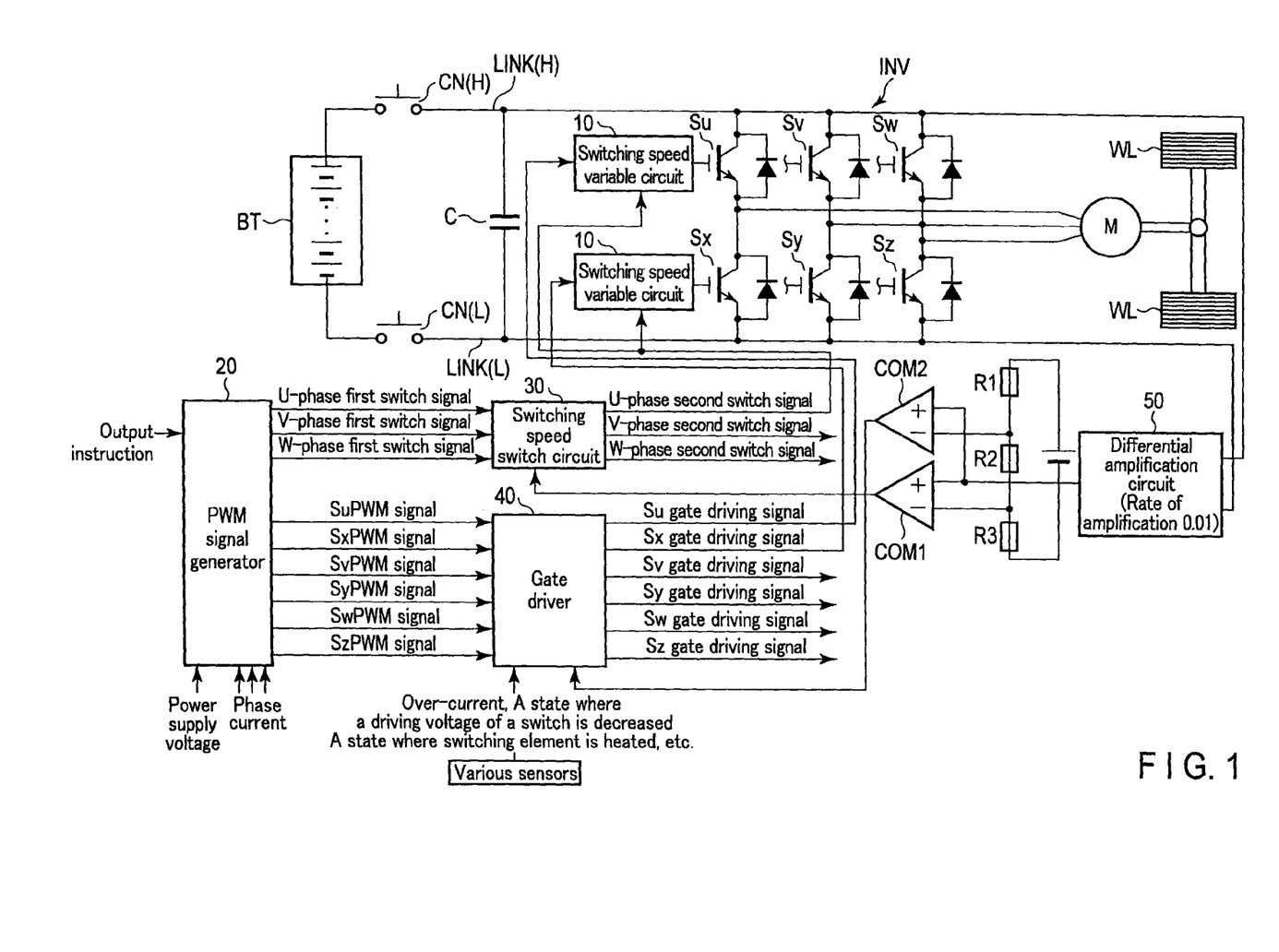
FIG. 1 illustrates an example configuration of an inverter control apparatus, a power conversion apparatus, and an electric vehicle according to an embodiment.

FIG. 1 illustrates an example configuration of the inverter control apparatus, the power conversion apparatus, and the electric vehicle according to an embodiment.

The electric vehicle of the present embodiment includes a direct current (DC) power supply BT, a power conversion device, a motor M, and wheels WL and WL to which a power of the motor M is conveyed through an axle. The power conversion device includes an inverter INV and an inverter control device.

The DC power supply (direct current load) BT includes a storage battery such as a lithium ion battery and a nickel hydrogen battery. A direct current output from the DC power supply BT is supplied to the inverter INV, and the direct current power supply BT charges a load connected though the inverter INV with electric energy generated by the motor M, for example.

The inverter INV is a three-phase inverter that converts a DC power supplied from the DC power supply BT to a three-phase AC power. The inverter INV includes a plurality of switches Su, Sx, Sv, Sy, Sw, and Sz and a smoothing capacitor C. The inverter INV supplies a three-phase AC current to the motor M by opening or closing the plurality of switches Su, Sx, Sv, Sy, Sw, and Sz in accordance with a gate driving signal from a driving circuit 40 described later.

The inverter INV is connected between the DC power supply BT and the load. The inverter INV includes a plurality of switch circuits having a pair of switches connected in series between DC lines LINK (H) and LINK (L) that supply a current from the DC power supply BT. A U-phase switch circuit includes switches Su and Sx, a V-phase switch circuit includes switches Sv and Sy, and a W-phase switch circuit includes switches Sw and Sz. The switch circuits are connected in parallel with each other. In each phase, a pair of switches are connected in series, and a connected point of the switches is connected to the motor M via an AC line. For example, in the U-phase, a pair of switches Su and Sx are connected in series, and a connected point of the switches Su and Sx is connected to the motor M. The switches Su, Sx, Sv, Sy, Sw, and Sz are capable of electrically controlling the opening and closing of an Insulated Gate Bipolar Transistor (IGBT), a Field-Effect Transistor (FET), a gate turn-off thyristor (GTO), a transistor, etc.

The smoothing capacitor C is connected between the DC line LINK (H) at the high potential side and the DC line LINK (L) at the low potential side, and connected in parallel with the plurality of switches Su, Sx, Sv, Sy, Sw, and Sz and the DC power supply BT between the DC power supply BT and the inverter INV. The smoothing capacitor C controls changes in voltage of the DC lines LINK (H) and LINK (L) by the operation of the inverter INV.

The inverter INV and the DC power supply BT are connected or opened by the contactor CN. The contactor CN is provided in each of the DC lines LINK (H) and LINK (L). The contactor CN is a means performing opening or closing operations of the DC lines LINK (H) and LINK (L) in accordance with a control signal from an upper controller, such as an electro-magnetic contactor. An AC line is connected between the inverter INV and a AC load, and an AC current can be supplied between the inverter INV and the AC load through the AC line.

The motor (AC load) M generates a torque by a current supplied from the inverter INV. The torque generated by the connection of a load device is conveyed to the output axis of the motor M. The motor M performs a regenerative operation by converting kinetic energy of the load device into power. The power obtained by the regenerative operation of the motor M is converted into the DC power in the inverter INV, and the DC power supply BT is charged with the DC power. In this embodiment, the output axis of the motor M is connected to an axle, and a torque generated at the motor is conveyed to the wheel WL through the axle. The motor M performs a regenerative operation by converting kinetic energy of the wheel WL to which the torque is conveyed through the axle into power.

The inverter control device includes a switching speed variable circuit 10, a PWM signal generation device 20, a switching speed switch circuit 30, a driving circuit 40, a differential amplification circuit 50, a power supply 60, resistors R1, R2, and R3, a first comparator COM1, and a second comparator COM2.

The switching speed variable circuit 10 is connected to each of the switches Su, Sx, Sv, Sy, Sw, and Sz as a preprocessing format of each gate. In FIG. 1, the switching speed variable circuits 10 are shown only as a preprocessing format of the gate of each of the switches Su and Sx, and the switching speed variable circuits 10 connected to the switches Sv, Sy, Sw, and Sz are omitted. The switching speed variable circuit 10 includes a plurality of resistors, and changes the amount of gate resistance by switching resistors to be connected to the gates of the switches Su, Sx, Sv, Sy, Sw, and Sz in response to a switching speed switch signal (second switch signal) output from the switching speed switch circuit 30. A gate driving signal output from the driving circuit 40 is supplied to the gates of the switches Su, Sx, Sv, Sy, Sw, and Sz through the resistors of the switching speed variable circuit 10.

The PWM signal generation device 20 includes an arithmetic device such as a central processing unit (CPU) and a memory, for example. The PWM signal generation device 20 computes and outputs a PWM signal based on an output instruction that is externally input, a power supply voltage of the DC power supply BT (voltage between the DC lines LINK (H) and LINK (L)), a current of each phase (phase current) supplied to the motor M by the AC line, and a carrier wave pre-stored in the memory, in order to obtain a desired output value. The PWM signal is generated to each of the switches Su, Sx, Sv, Sy, Sw, and Sz.

If the PWM signal generation device 20 has determined that the voltage between the DC lines LINK (H) and LINK (L) exceeds a predetermined voltage threshold (fourth voltage threshold Vovth described later), the PWM signal generation device 20 outputs a signal to stop the operation of the inverter INV by opening the switches Su, Sx, Sv, Sy, Sw, and Sz.

The PWM signal generation device 20 outputs a switching speed switch signal (first switch signal) for the switch circuit of each phase. The PWM signal generation device 20 changes the speed of opening or closing the switches Su, Sx, Sv, Sy, Sw, and Sz in accordance with the voltage value between the DC lines LINK (H) and LINK (L) and the current value (phase current value) output to the motor M.

Figure 2:
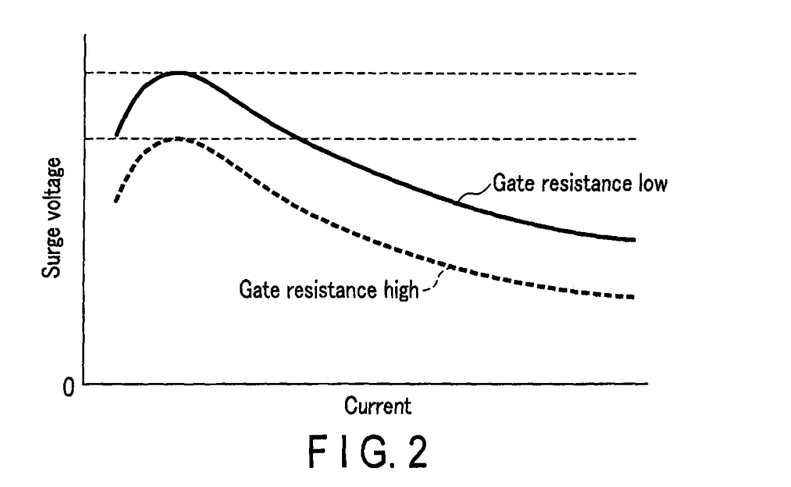
FIG. 2 illustrates an example of the relationship between a current flowing into a switch when the switch is closed (conduction) and a surge voltage.

FIG. 2 illustrates an example of the relationship between a current flowing into a switch when the switch is closed (conduction) and a surge voltage.

In FIG. 2, an example of characteristics for when the gate resistance of the switch is low is represented by a solid line, and an example of characteristics for when the gate resistance of the switch is high is represented by a broken line. When the gate resistance of the switch is low, the change in current flowing through the switch becomes large, and the switching speed becomes high when switching. When the gate resistance of the switch is high, the change in current flowing through the switch becomes small, and the switching speed becomes low when switching.

When the switch is closed, a surge voltage becomes large in an area where the current flowing through the switch is small. When the gate resistance of the switch is low, a surge voltage is larger than that of when the gate resistance of the switch is high.

According to the above characteristics, it is desirable that the gate resistance of the switch is increased in an area where the current flowing through the switch is small, namely, decreasing the switching speed, when the switch is closed (conduction).

Figure 3:
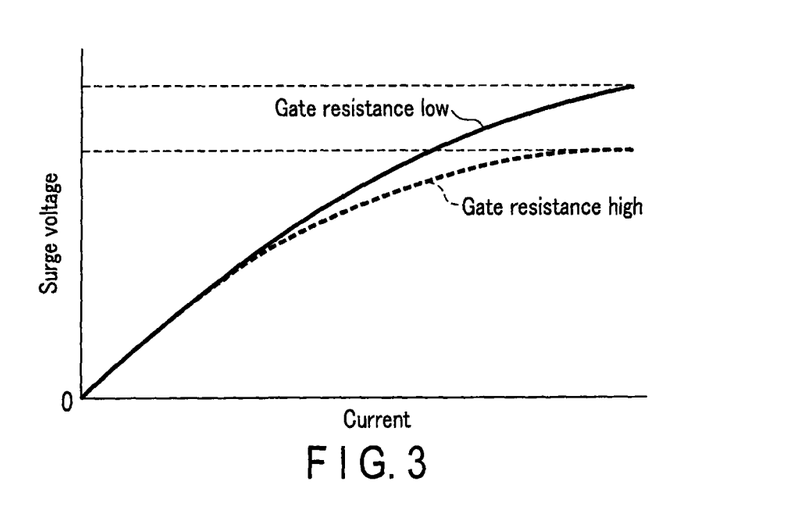
FIG. 3 illustrates an example of the relationship between a current flowing into a switch when the switch is opened (isolation) and a surge voltage.

FIG. 3 illustrates an example of the relationship between a current flowing into a switch when the switch is opened (insulation) and a surge voltage. In FIG. 3, an example of characteristics for the case where the gate resistance of the switch is low is represented by a solid line, and an example of characteristics for the case where the gate resistance of the switch is high is represented by a broken line.

When the switch is opened, a surge voltage becomes small in an area where the current flowing through the switch is small. When the gate resistance of the switch is low, a surge voltage is higher than that of when the gate resistance of the switch is high.

According to the above characteristics, it is desirable that the gate resistance of the switch is increased in an area where the current flowing through the switch is large, namely, decreasing the switching speed, when the switch is opened (insulation).

Figure 4:
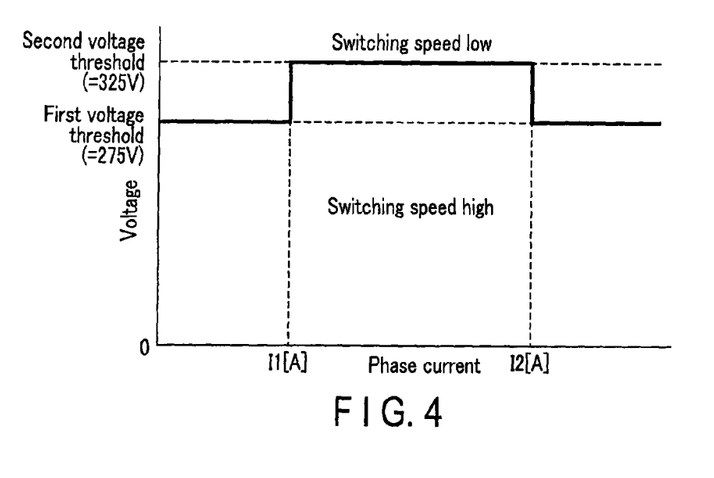
FIG. 4 illustrates an example of the relationship between a phase current, a voltage applied to the switch, and the switching speed in the inverter control apparatus, the power conversion apparatus, and the electric vehicle according to an embodiment.

FIG. 4 illustrates an example of the relationship between a phase current, a voltage applied between the DC lines, and the switching speed in the inverter control apparatus, the power conversion apparatus, and the electric vehicle according to an embodiment.

As explained with reference to FIGS. 2 and 3, it is desirable to decrease the switching speed in an area where the current flowing through the switch is small, and to decrease the switching speed in an area where the current flowing through the switch is large to avoid generation of an excessive surge voltage.

In addition, it is desirable that the difference between the value obtained by subtracting a maximum surge voltage value from the maximum rated voltage of the switch and the maximum value of the DC power supply within the normal operation range is equal to or greater than a predetermined value (over-voltage detection margin). However, if the switching speed is high and the voltage between the DC lines LINK (H) and LINK (L) is large, the surge voltage becomes large. In this situation, it would be difficult to provide an over-voltage detection margin. Accordingly, it is desirable to decrease the switching speed when the voltage between the DC lines LINK (H) and LINK (L) is large.

In view of the above, it is desirable that the switching speed of a semiconductor element is decreased to ensure an over-voltage detection margin in the situation where a surge voltage is expected to be large, and that the switching speed of a semiconductor element is increased to reduce switching loss in the situation where a surge voltage is expected to be small. Accordingly, it is desirable that a voltage threshold for the voltage between the DC lines LINK (H) and LINK (L) is set to be low when the switching speed is decreased in the case where the current flowing through the switches Su, Sx, Sv, Sy, Sw, and Sz is less than a predetermined threshold (first current threshold I1) and equal to or greater than a predetermined threshold (second current threshold I2).

In the present embodiment, the switching speed is set to be low when the voltage between the DC lines LINK (H) and LINK (L) is equal to or greater than a first voltage threshold (e.g., 275V) in the case where the current flowing through the switches Su, Sx, Sv, Sy, Sw, and Sz is less than the predetermined threshold (first current threshold I1), and equal to or greater than the predetermined threshold (second current threshold I2). The switching speed is set to be low when the voltage between the DC lines LINK (H) and LINK (L) is equal to or greater than a second voltage threshold (e.g., 325V) in the case where the current flowing through the switches is equal to or greater than the first current threshold I1 and less than the second current threshold I2.

In other words, in this embodiment, the PWM signal generation device 20 outputs a first switch signal to allow the switching speed to be "high-speed" (allow the gate resistance to be "small") when: the current output to the motor M from the inverter INV (current flowing through the switch) is less than the first current threshold I1[A], and the voltage between the DC lines LINK (H) and LINK (L) is less than 275[V]; when the current output to the motor M from the inverter INV is equal to or greater than the second current threshold I2[A], and the voltage between the DC lines LINK (H) and LINK (L) is less than 275[V]; and when the current output to the motor M from the inverter INV is equal to or greater than the first current threshold I1[A], and less than the second current threshold I2[A], and the voltage between the DC lines LINK (H) and LINK (L) is less than 325[V].

In addition, the PWM signal generation device 20 outputs a first switch signal to allow the switching speed to be "low-speed" (allow the gate resistance to be "large") when: the current output to the motor M from the inverter INV is less than the first current threshold I1[A], and the voltage between the DC lines LINK (H) and LINK (L) is equal to or greater than 275[V]; when the current output to the motor M from the inverter INV is equal to or greater than the second current threshold I2[A], and the voltage between the DC lines LINK (H) and LINK (L) is equal to or greater than 275[V]; and when the current output to the motor M from the inverter INV is equal to or greater than the first current threshold I1[A], and less than the second current threshold I2[A], and the voltage between the DC lines LINK (H) and LINK (L) is equal to or greater than 325[V].

In this situation, the PWM signal generation device 20 may independently change the switching speed of the switch circuit of each of the U-phase, V-phase, and W-phase, or simultaneously change the switching speed of the switch circuits for all three phases.

Changing the switching speed in accordance with the voltage of the DC lines and the current of the AC line achieves prevention of a surge voltage by ensuring a low switching speed when an over-voltage is detected, while preventing a switching loss.

The switching speed switch circuit 30 receives a first switch signal from the PWM signal generation device 20, and a signal from the first comparator COM1. The switching speed switch circuit 30 outputs a second switch signal having the same value as the first switch signal when the signal received from the first comparator COM1 is a second level (e.g., low (L) level). The switching speed switch circuit 30 outputs a second switch signal to allow the switching speed of each of the switches of all phases to be "low speed" when the signal received from the first comparator COM1 is a first level (e.g., high (H) level).

The switching speed switch circuit 30 outputs the second switch signal to the inverter INV to set the gate resistance value to be high when at least one of the output signal of the first comparator COM1 and the first switch signal is the first level, and outputs the second switch signal to the inverter INV to set the gate resistance value to be low when both of the output signal of the first comparator COM1 and the first switch signal are the second level.

The driving circuit 40 receives a PWM signal corresponding to each of the switches Su, Sx, Sv, Sy, Sw, and Sz from the PWM signal generation device 20, and a signal from the second comparator COM2, and a signal from each of various sensors. The signal from each of various sensors is a signal indicating a state where the output current of the inverter INV is equal to or greater than a threshold (over-current), a state where a driving voltage of a switch is decreased, a state where a switching element is heated, or an abnormal state of the inverter INV.

The driving circuit 40 generates a gate driving signal by using the PWM signal received from the PWM signal generation device 20 when an abnormal state of the inverter INV is not reported from various sensors, and the signal from the second comparator COM2 is the second level (e.g., low (L) level), and outputs the gate driving signal to the switching speed variable circuit 10 of each of the switches Su, Sx, Sv, Sy, Sw, and Sz. In general, it is desirable that a gate driving signal is generated to provide a dead time period where both of upper and lower switches are turned off to prevent an electrical short-circuit of the upper and lower switches of each phase of the inverter INV.

The driving circuit 40 outputs a gate driving signal to stop the operation of the inverter INV by opening the switches Su, Sx, Sv, Sy, Sw, and Sz when an abnormal state of the inverter INV is reported from various sensors, and the signal from the second comparator COM2 is the first level (e.g., high (H) level).

The differential amplification circuit 50 amplifies the difference between the voltage of the DC line LINK (L) at the low potential side and the voltage of the DC line LINK (H) at the high potential side. In the present embodiment, the rate of amplification of the differential amplification circuit 50 is set to be 0.01. The output of the differential amplification circuit 50 is input to non-inverse (+) input terminals of the first comparator COM1 and the second comparator COM2.

The power supply 60, the first resistor R1, the second resistor R2, and the third resistor R3 are connected in series with each other. The first resistor R1, the second resistor R2, and the third resistor R3 are connected in the order given from the high potential side of the power supply 60.

The output value of the differential amplification circuit 50 is input to the non-inverse (+) input terminal of the second comparator COM2, and a potential between the resistors R2 and R3 is input to an inverse (−) input terminal. The value to be input to the inverse input terminal of the second comparator COM2 is a value corresponding to the voltage threshold (fourth voltage threshold) Vovth used by the PWM signal generation device 20 to determine that the voltage between the DC lines LINK (L) and LINK (H) is an over-voltage.

The second comparator COM2 outputs a high (H) level signal when the output value from the differential amplification circuit 50 is equal to or greater than the value corresponding to the fourth voltage threshold Vovth, and outputs a low (L) level signal when the output value from the differential amplification circuit 50 is less than the value corresponding to the fourth voltage threshold Vovth.

The output value of the differential amplification circuit 50 is input to the non-inverse (+) input terminal of the first comparator COM1, and a potential between the resistors R2 and R3 is input to an inverse (−) input terminal. The value to be input to the inverse input terminal of the first comparator CM1 is a value corresponding to a third voltage threshold Vlsth smaller than the fourth voltage threshold Vovth.

In this embodiment, the fourth voltage threshold Vovth is a threshold used by the PWM signal generation device 20 to detect an over-voltage of the inverter INV, and the third voltage threshold Vlsth is set to be the same as a second voltage threshold shown in FIG. 4 (e.g., 325V) (or the same as the first voltage threshold). The power supply 60, the first resistor R1, the second resistor R2, and the third resistor R3 are designed in accordance with the setting of the rate of amplification of the differential amplification circuit 50, the third voltage threshold, and the fourth voltage threshold.

The first comparator COM1 outputs a first level (e.g., high (H) level) signal when the output value from the differential amplification circuit 50 is equal to or greater than the value corresponding to the third voltage threshold Vlsth, and outputs a second level (e.g., low (L) level) signal when the output value from the differential amplification circuit 50 is less than the value corresponding to the third voltage threshold Vlsth.

Figure 5:
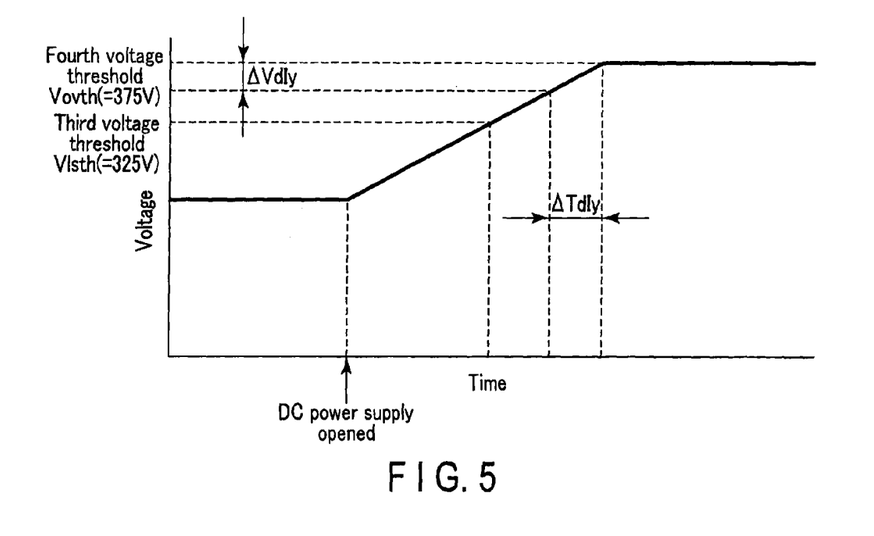
FIG. 5 illustrates an operation of the inverter control apparatus, the power conversion apparatus, and the electric vehicle according to an embodiment.

FIG. 5 illustrates an operation of the inverter control apparatus, the power conversion apparatus, and the electric vehicle according to an embodiment.

FIG. 5 illustrates an example of change in voltage between the DC lines LINK (H) and LINK (L) over time when the contactor CN is opened, and thereby opening the DC power supply BT during the regenerative operation of the inverter INV.

If the contactor CN is opened due to a failure of an upper controller during the regenerative operation of the inverter INV, the voltage of the smoothing capacitor C abruptly increases, and accordingly, the voltage between the DC lines LINK (H) and LINK (L) abruptly increases.

In this situation, the PWM signal generation device 20 detects an over-voltage when the voltage between the DC lines LINK (H) and LINK (L) becomes equal to or greater than the fourth voltage threshold Vovth, and generates and outputs a PWM signal to stop the operation of the inverter INV by opening the switches Su, Sx, Sv, Sy, Sw, and Sz.

However, a predetermined time ΔTdly is required from the determination by the PWM signal generation device 20 that the voltage between the DC lines LINK (H) and LINK (L) is equal to or greater than the fourth voltage threshold Vovth until the inverter INV is stopped. Thus, the fourth voltage threshold Vovth should be set in consideration of the voltage increase ΔVdly between the DC lines LINK (H) and LINK (L) during the predetermined time ΔTdly from the time when the PWM signal generation device 20 detects the over-voltage to the time when the inverter INV is stopped. That is, the fourth voltage threshold Vovth should be a value obtained by subtracting the maximum surge voltage value and the voltage increase ΔVdly from the maximum rated voltage of the switch.

In addition, it is necessary to provide an over-voltage detection margin between the maximum value within the normal operation voltage range of the DC power supply BT and the fourth voltage threshold Vovth to avoid misdetection of an over-voltage in the normal operation of the inverter INV.

If the switching speed of the switches Su, Sx, Sv, Sy, Sw, and Sz is high, the surge voltage becomes large. Accordingly, the fourth voltage threshold Vovth should be set as low. In this case, it is difficult to provide an over-voltage detection margin between the maximum value within the normal operation voltage range of the DC power supply BT and the fourth voltage threshold Vovth.

Under these circumstances, in the present embodiment, if the voltage between the DC lines LINK (H) and LINK (L) becomes equal to or greater than the third voltage threshold Vlsth lower than the fourth voltage threshold Vovth used to detect an over-voltage, the switching speed switch circuit 30 forcibly changes to a lower switching speed. This ensures lowering the switching speed at the time of detection of an over-voltage.

The switching speed switch circuit 30 switches the gate resistance of the switch based on the output value of the first comparator COM1 that is set by comparing the output of the differential amplification circuit 50 with the value corresponding to the third voltage threshold Vlsth. Accordingly, the switching speed switch circuit 30 can switch to a lower switching speed more quickly than the case where the CPU of the PWM signal generation device 20 determines that the voltage is equal to or greater than the third voltage threshold Vlsth based on the phase current, and outputs the first switch signal. That is, since the PWM signal generation device 20 performs both calculation for generating a PWM signal and calculation for generating a first switch signal, the number of calculations becomes large when an over-voltage occurs, and the processing time may be longer. In this situation, the switching speed switch circuit 30 directly switches the second switch signal based on the comparison between the voltage between the DC lines LINK (H) and LINK (L) and the threshold. Thus, it is possible to switch the signal more quickly than the PWM signal generation device 20 does.

Accordingly, even if the voltage between the DC lines LINK (H) and LINK (L) is abruptly increased when the contactor CN is opened during the regenerative operation of the inverter INV and the DC power supply BT is opened, the occurrence of a surge voltage can be prevented by ensuring that the switching speed is low when an over-voltage is detected without setting a large over-voltage detection margin.

As stated above, the PWM signal generation device 20 changes the switching speed of the switch circuit in accordance with the phase current so that the switching speed is set to be low when a surge voltage to be applied to the DC lines LINK (H) and LINK (L) will become large, and the switching speed is set to be high when a surge voltage will become small. This prevents the application of an excessive voltage to a switch, and makes it possible to suppress increases of switching loss in the inverter INV.

In addition, in the present embodiment, the switching speed is changed by the PWM signal generation device 20 and the switching speed switch circuit 30. This prevents the application of an excessive voltage to a switch when the voltage between the DC lines LINK (H) and LINK (L) is abruptly increased.

Furthermore, in the present embodiment, even if the voltage between the DC lines LINK (H) and LINK (L) is equal to or greater than the fourth voltage threshold Vovth which is used to detect an over-voltage, the switching speed is low at that time. Accordingly, it is possible to provide an over-voltage detection margin between the maximum value of the normal operation voltage range of the DC power supply BT and the fourth voltage threshold Vovth. As a result, the present embodiment can prevent erroneous detection of an over-voltage.

In addition, in the present embodiment, the switching speed switch circuit 30 forcefully switches the switching speed to be low only when the voltage between the DC lines LINK (H) and LINK (L) is equal to or greater than the third voltage threshold Vlsth. Accordingly, it is possible to suppress increases of switching loss in the inverter.

As stated above, the present embodiment can provide an inverter control apparatus, power conversion apparatus, and electric vehicle with high reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions. For example, the DC load and AC load are not limited to those described in the above embodiment. In the embodiment, the third voltage threshold Vlsth and the second voltage threshold are the same; however, the third voltage threshold Vlsth, based on which the switching speed switch circuit 30 switches the gate resistance, is not limited to be the same as the second voltage threshold. The third voltage threshold Vlsth, based on which the switching speed switch circuit 30 changes the gate resistance, may be any value smaller than the fourth voltage threshold Vovth, and can be set as the first voltage threshold or a value corresponding to the first voltage threshold. However, the third voltage threshold Vlsth based on which the switching speed switch circuit 30 changes the gate resistance should be a value ensuring that the switching speed becomes low at the time of detecting an over-voltage.

In the above embodiment, the first switch signal output by the PWM signal generation device 20 is input to the switching speed variable circuit 10 through the switching speed switch circuit 30. However, the first switch signal may be input to the switching speed variable circuit 10 from the PWM signal generation device 20 to omit the switching speed switch circuit 30. That is, the switching speed switch circuit 30 may receive at least one of the first and second switch signals and a gate driving signal, and change the gate resistance of the switch in accordance with the first or second switch signal. Even in this situation, the switching speed is set to be low when a surge voltage becomes large, and the switching speed is set to be high when the surge voltage becomes small, thereby providing an inverter control apparatus, power conversion apparatus, and electric vehicle with high reliability.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An inverter controller comprising:
a PWM signal generator that receives an output instruction from an external device, a value of a voltage between DC lines connected between a DC load and an inverter, and a value of a current of an AC line connected between the inverter and an AC load, that generates and outputs a PWM signal for each of a plurality of switches of the inverter to accomplish a value indicated by the output instruction, and that outputs a first switch signal to select a resistance value of one of a plurality of resistors based on the values of the voltage between the DC lines and the current of the AC line, the plurality of resistors each being connected to each of gates of the switches in parallel and having a different resistance value; and
a driving circuit that outputs a gate driving signal to each of the switches upon reception of the PWM signal, wherein the PWM signal generator outputs the first switch signal to increase the resistance value when the value of the voltage between the DC lines is equal to or greater than a first voltage threshold, and the value of the current of the AC line is less than a first current threshold; and when the value of the voltage between the DC lines is equal to or greater than the first voltage threshold, and the value of the current of the AC line is equal to or greater than a second current threshold which is greater than the first current threshold, and wherein the PWM signal generator outputs the first switch signal to increase the resistance value when the value of the voltage between the DC lines is equal to or greater than a second voltage threshold which is greater than the first voltage threshold, and the value of the current of the AC line is equal to or greater than the first current threshold and less than the second current threshold.

2. The inverter controller according to claim 1, further comprising:

an amplification circuit that amplifies and outputs the voltage between the DC lines;

a comparator that receives an output of the amplification circuit at a non-inverse input terminal, and a value corresponding to a third voltage threshold at an inverse input terminal; that outputs a first level signal when a value of the output of the amplification circuit is equal to or greater than the value corresponding to the third voltage threshold; and that outputs a second level signal when the value of the output of the amplification circuit is less than the value corresponding to the third voltage threshold; and a switching speed switch circuit that receives an output signal from the comparator and the first switch signal; that outputs a second switch signal to select the resistance value of one of the plurality of resistors to the inverter to increase the resistance value when at least one of the output signal of the comparator and the first switch signal is a first level signal; and that outputs the second switch signal to decrease the resistance value when both of the output signal of the comparator and the first switch signal are a second level signal.

3. An electric power converter comprising:
the inverter controller according to claim 1;
an inverter connectable between the DC load and the AC load comprising:
the DC lines connected to the DC load; a pair of switches connected in series between the DC lines;
the AC line connected between a connected point of the switches and the AC load; and
a switching speed variable circuit that receives the first switch signal and the gate driving signal, and that selects one of the plurality of resistors in accordance with the first switch signal and outputs the gate driving signal to a gate.

4. An electric power converter comprising:
the inverter controller according to claim 2;
an inverter connectable between the DC load and the AC load comprising:
the DC lines connected to the DC load;
the switches connected in series between the DC lines;
the AC line connected between a connected point of the switches and the AC load; and
a switching speed variable circuit that receives at least one of the first and second switch signals and the gate driving signal, and that selects one of the plurality of resistors in accordance with the first switch signal or the second switch signal, and outputs the gate driving signal to the gate.

5. An electric vehicle comprising:
the electric power converter according to claim 3;
a DC power supply that is the DC load;
a motor that is the AC load; and
an axle that conveys power of the motor to a wheel.

6. An electric vehicle comprising:
the electric power converter according to claim 4;
a DC power supply that is the DC load;
a motor that is the AC load; and
an axle that conveys power of the motor to a wheel.

* * * * *